(12) United States Patent
Vashchenko et al.

(10) Patent No.: US 6,784,029 B1
(45) Date of Patent: Aug. 31, 2004

(54) BI-DIRECTIONAL ESD PROTECTION STRUCTURE FOR BICMOS TECHNOLOGY

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/121,514

(22) Filed: Apr. 12, 2002

(51) Int. Cl.[7] .......................................... H01L 21/8248
(52) U.S. Cl. ................................................... 438/129
(58) Field of Search ................................ 438/129, 200, 438/202, 210, 238, 381; 257/362, 357

(56) References Cited

U.S. PATENT DOCUMENTS

| | | | | |
|---|---|---|---|---|
| 5,182,220 A | * | 1/1993 | Ker et al. | 438/200 |
| 5,212,618 A | * | 5/1993 | O'Neill et al. | 361/56 |
| 5,572,394 A | * | 11/1996 | Ker et al. | 361/56 |
| 5,602,404 A | * | 2/1997 | Chen et al. | 257/112 |
| 5,821,572 A | * | 10/1998 | Walker et al. | 257/107 |
| 5,844,280 A | * | 12/1998 | Kim | 257/355 |
| 5,939,756 A | * | 8/1999 | Lee | 257/355 |
| 5,973,509 A | * | 10/1999 | Taniguchi et al. | 326/81 |
| 6,236,087 B1 | * | 5/2001 | Daly et al. | 257/355 |
| 6,258,634 B1 | * | 7/2001 | Wang et al. | 438/133 |
| 2001/0040254 A1 | * | 11/2001 | Takiguchi | 257/341 |
| 2002/0017654 A1 | * | 2/2002 | Lee et al. | 257/173 |

OTHER PUBLICATIONS

Wu et al , "A new On–Chip ESD Protection Circuit with Dual Parasitic SCR Structures for CMOS VLSI", Mar. 1992, IEEE Journal of Solid–State Circuits, vol. 27, No. 3, p. 274–280.*

* cited by examiner

Primary Examiner—George Fourson
(74) Attorney, Agent, or Firm—Jurgen Vollrath

(57) ABSTRACT

In a Bi-CMOS ESD protection device, dual voltage capabilities are achieved by providing two laterally spaced p-regions in a n-material and defining a n+ region and a p+ region in each of the p-regions to define I–V characteristics that are similar to those defined by a SCR device in a positive direction, but, in this case, having those characteristics in both directions. The device may be asymmetrical to accommodate different voltage amplitudes in the positive and negative directions.

4 Claims, 4 Drawing Sheets

BI-DIRECTIONAL ESD PROTECTION STRUCTURE FOR BICMOS TECHNOLOGY

FIELD OF THE INVENTION

The invention relates to ESD protection devices. More particularly, it relates to ESD protection devices that are implemented using BiCMOS technology.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. ESD protection devices have, therefore, been devised to shunt current to ground during excessive voltage peaks.

In the case of BiCMOS output interface circuits that allow dual polarity of the output voltage amplitude (so-called "swing"), conventional triggering ESD structures such as SCRs, LVTSCRs, GGNMOS, TFO devices and even diode pairs are unsuitable. When these devices are reverse biased or a reverse power supply is applied, a substantial amount of power is consumed by the internal diode structure, as is discussed in greater detail below.

The ESD protection device or triggering structure for dual polarity applications should therefore display an S-shaped I–V characteristic for voltage swings in both directions. Bi-directional thyristor devices such as TRIACs (triode AC switches) and DIACs (diode AC switches) (for example AC trigger diodes and bi-directional p-n-p-n diode switches) exist that provide for bi-directional voltage swings. However, ESD protection devices require specific functional specifications in order to operate within a specific window. The triggering voltage may not be too high, to avoid damage to the circuit being protected. Also, the triggering structure must not remain in conduction once the ESD pulse has passed and normal voltages resume. Thus, the holding voltage of the device must be sufficiently high to avoid latch-up during normal operation. Furthermore, in the case of integrated circuits based on BiCMOS technology it is desirable to implement the protection circuit using existing process steps.

The present invention therefore provides a triggering ESD structure that can readily be implemented in BiCMOS technology and which provides for bi-directional voltage swings.

SUMMARY OF THE INVENTION

The present invention provides a BiCMOS ESD protection device with dual voltage capabilities. This is achieved by providing two laterally spaced p-regions in a n-material and defining a n+ region and a p+ region connected by a common contact, in each of the p-regions. In this way a device is defined that has I–V characteristics that are similar to those defined by a SCR device in a positive direction, but, in this case, having those characteristics in both directions. The device may be asymmetrical to accommodate different voltage amplitudes in the positive and negative directions.

According to the invention, there is provided an ESD protection structure having a first p-region formed in a n-material; a second p-region formed in the n-material and laterally spaced from the first p-region; a first n+ region and a first p+ region formed in the first p-region, and connected by a first common contact, and a second n+ region and a second p+ region formed in the second p-region, and connected by a second common contact One or both of the p-regions may comprises a p-deep region, a p-well, or a P-body. A shallow trench isolation region or thick field oxide may be formed between the first p-region and the second p-region. Furthermore, a sinker region may be formed between the first p-region and the second p-region.

Further, according to the invention, there is provided a method of forming a bi-directional ESD protection device, comprising providing a semiconductor substrate, n-doping at least part of the semiconductor substrate to form n-material, masking and doping the n-material to define a first and a second p-region in the n-material that are laterally spaced from each other, forming a n+ region and a p+ region laterally spaced from each other, in each of the two p-regions, and providing a common contact for both of the n+ region and p+ region of the two p-regions. Ideally BiCMOS technology is used in the process steps. Typically the n+ region and p+region in each of the p-regions are formed by masking and doping the p-regions. The p-regions may be defined by one or more of a p-well, p-body, collector, or p-deep type implant. The method may include n-doping the region between the p-regions to define a higher doped region between the p-regions, for example, forming a sinker region between the p-regions. The size and location of the higher doped region between the p-regions may be chosen to achieve desired triggering and holding voltage characteristics for the device. The method may further include forming one or more ISO, NBL, or lightly doped regions in the n-material. Also, the first p-region may be different from the second p-region to define an asymmetrical structure. This difference in the p-regions may be in one or more of the doping level, thickness, and width of the p-regions.

DETAILED DESCRIPTION OF THE INVENTION

As mentioned above, a prior art silicon-controlled rectifier (SCR) does not provide a dual voltage capability. Nevertheless, it provides desirable snapback characteristics to display a S-shaped I–V curve in the forward direction. The present invention therefore provides a triggering structure that incorporates some of the features of a SCR. Therefore, an understanding of the functioning of a SCR is helpful in considering the structure of the present invention.

A SCR, essentially, is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. When used for ESD protection, the first node becomes a to-be-protected node, and the second node is typically connected to ground. The SCR operates within an ESD protection window that has a maximum voltage defined by the destructive breakdown level of the to-be-protected node, and a minimum voltage (also known as a latch-up voltage) defined by any dc bias on the to-be-protected node.

Figure 1:
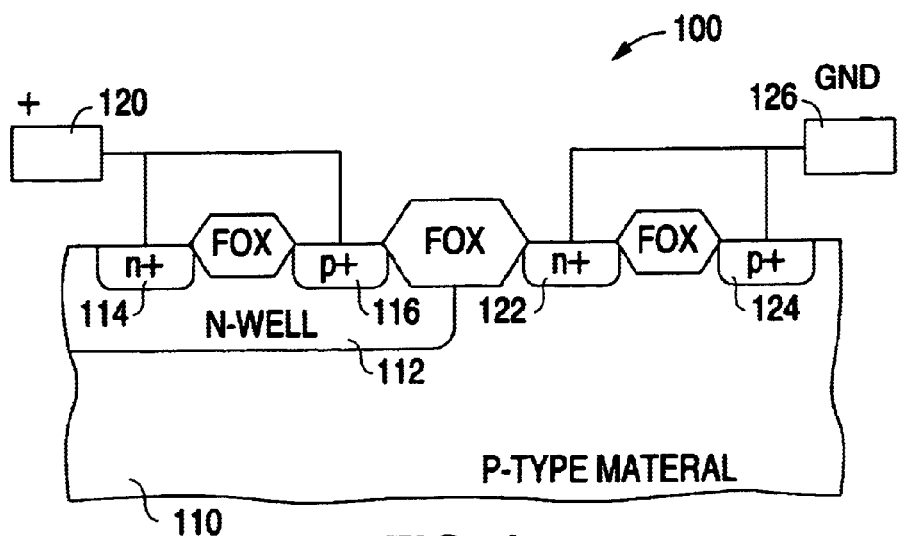
FIG. 1 is a cross-sectional view of a conventional SCR.

Thus, when the voltage across the to-be-protected node and the second node is less than the trigger voltage, the SCR provides an open circuit between the to-be-protected node and the second node. However, when the to-be-protected node receives a voltage spike that equals or exceeds the trigger voltage, such as when an ungrounded human-body discharge occurs, the SCR provides a low-resistance current path from the to-be-protected node to the second node. In addition, once the ESD event has passed and the voltage on the to-be-protected node falls below the holding voltage, the SCR again provides an open circuit between the to-be-protected node and the second node FIG. 1 shows a cross-sectional view that illustrates a conventional SCR 100. As shown in FIG. 1, SCR 100 has a n-well 112 which is formed in a p-type semiconductor material 110, such as a substrate or a well, and a n+ region 114 and a p+ region 116 which are formed in n-well 112. The n+and p+ regions 114 and 116 are both connected to a to-be-protected node 120. As further shown in FIG. 1, SCR 100 also has a n+ region 122 and a p+ region 124 formed in semiconductor material 110. The n+and p+ regions 122 and 124 are both connected to an output node 126.

In operation, when the voltage across nodes 120 and 126 is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication, The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+(emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the emitter of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+(emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

Thus the SCR provides for double injection by n+ region 122 and p+ region 116 of SCR 100. With double injection, SCR 100 provides current densities (after snapback) that are about ten times greater than the densities provided by a grounded-gate MOS device.

Figure 2:
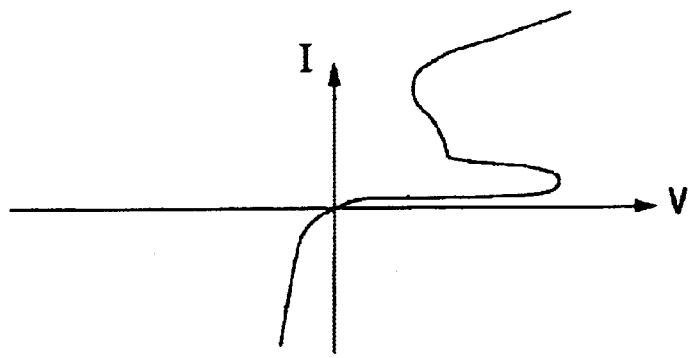
FIG. 2 is the I–V characteristic for the SCR of FIG. 1.

The resultant I–V characteristics of the SCR are shown in FIG. 2 which shows a S-shaped curve in the forward direction. On the other hand when the SCR experiences a voltage pulse in the opposite direction, the structure acts simply as a forward biased diode due to the forward biased junction between p-substrate 110 and n-well 112. This results in large power dissipation due to the increasing currents shown in FIG. 2.

Figure 3:
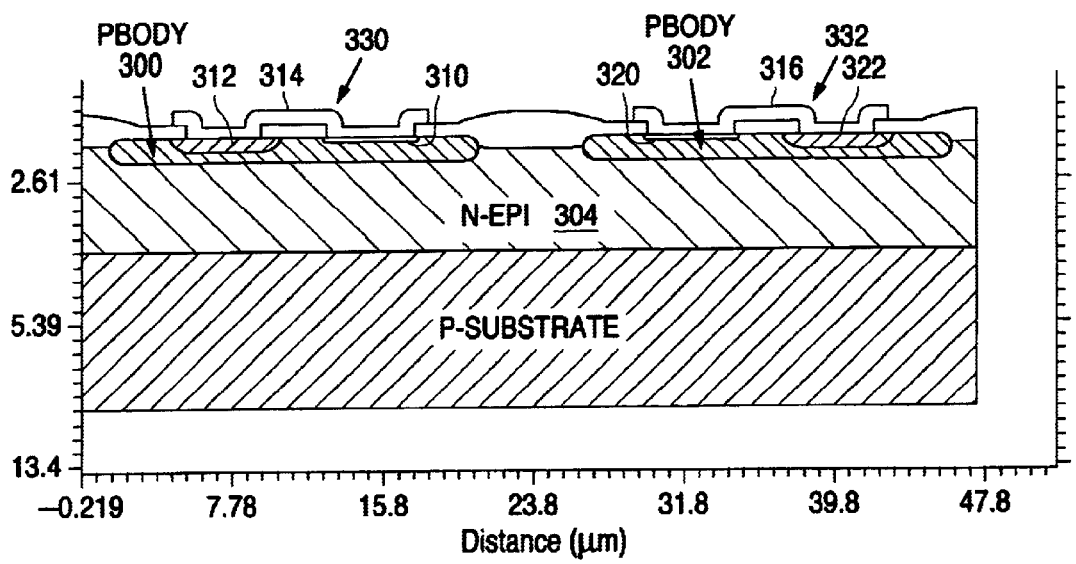
FIG. 3 is a cross-sectional view of one embodiment of a triggering structure of the invention.

One embodiment of the structure of the present invention is shown in FIG. 3. It includes a p-body 300 and a p-body 302 formed in a n-epitaxial region 304, and laterally spaced from each other. In another embodiment, the p-body regions 300, 302 were separated by a thick field oxide or shallow trench isolation (STI) region. A n+ region 310 and a p+ region 312 are formed in the p-body 300. Similarly, a n+ region 320 and a p+ region 322 are formed in the p-body 302. Thus, this embodiment of the invention provides a symmetrical structure with two p-regions 300, 302. While the embodiment of FIG. 3 speaks of a p-body regions, it will be appreciated that these p-regions can be created by any process step(s) commonly used in a BiCMOS process, such as deep well, body, collector, or other type implant. The n+ region 310 and p+ region 312 are connected by a common contact 314 to define the anode, and the n+ region 320 and p+ region 322 are connected by a common contact 316 to define the cathode.

Figure 4:
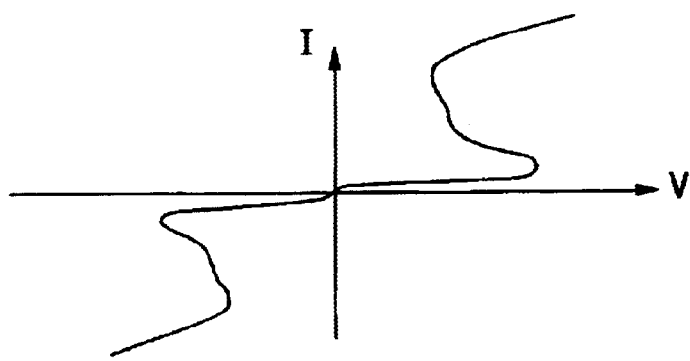
FIG. 4 is the I–V characteristic of the structure of FIG. 3.

Prior to avalanche breakdown the structure is equivalent to a PNP bipolar transistor with the p+ region 300 acting as emitter, the n-epitaxial region as the base, and the p+ region 302 as the collector. The junction between the n+ region 310 and n-epitaxial region 304 is reverse biased at this stage and, therefore, blocks the current and determines the leakage. However, at the voltage level of avalanche breakdown, this lateral junction produces an avalanche current. The breakdown of the junction causes a large number of holes to be injected into the p-body material 302, and a large number of electrons to be injected into n+ region 310. The increased number of holes increases the potential of the material 302 in the region that lies adjacent to the n+ region 320, and eventually forward biases the junction between n+ region 320 and p-body 302. This results in a npn transistor in which electrons are injected from the emitter 320 into the base 302 to turn the transistor on. Electrons are injected into the n-epi 304. Some electrons combine with holes in the n-epi 304 but most are swept across to the n+ region 330. This also reduces the potential of the n-epi 304 in the region of the p-body 300. This results in a pnp transistor which injects holes from the emitter 312 into the base 304 and causes most of the holes to be swept across to the p-body 302 further turns on the base of the npn tranistor. Thus, due to the positive feedback, a deep bipolar conductivity modulation is created between the anode 330 and the cathode 332, which results in space charge modulation, electric field dumping, avalanche ionization, and eventually double injection conductivity. Due to the symmetrical nature of the structure, a S-shaped curve is achieved for both a positive and a negative voltage pulse, as shown by the I–V characteristics of FIG. 4. This embodiment with its low doped n-epi lends itself to use in high voltage applications.

Figure 5:
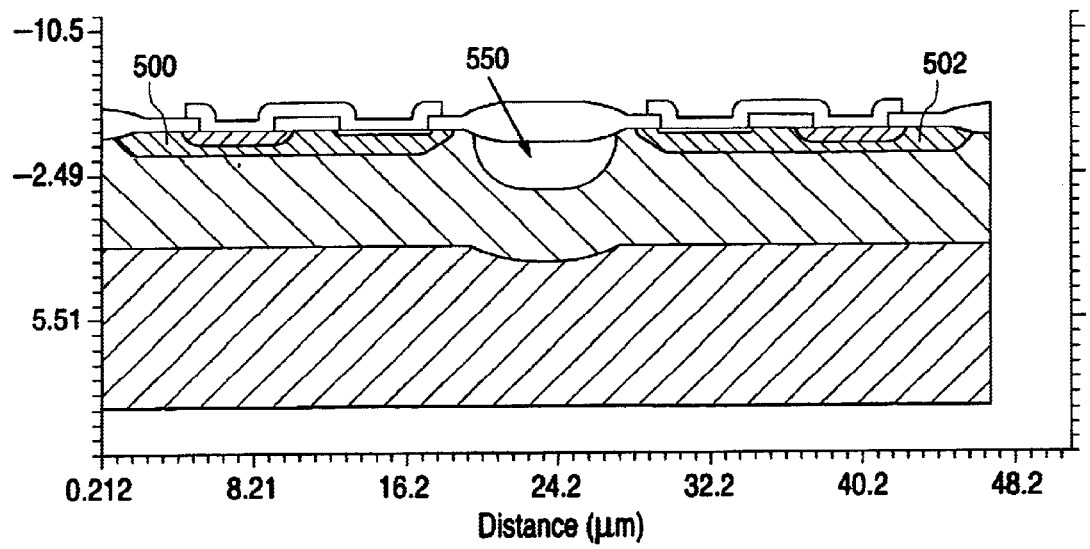
FIG. 5 is a cross-sectional view of another embodiment of the invention.
Figure 6:
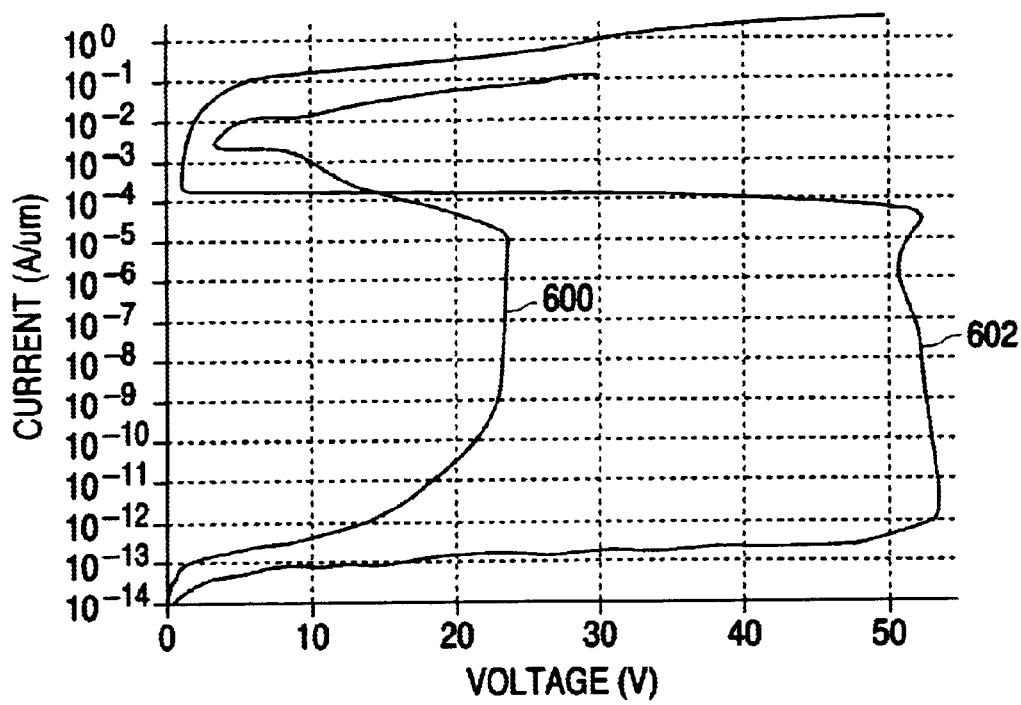
FIG. 6 is shows I–V characteristics for the device of FIG. 5 compared to that of FIG. 3.

In another embodiment, shown in FIG. 5, a higher doped n-sinker region 550 is created between the p-body regions 500, 502. This results in a lower breakdown voltage, which will occur below the original zener diode breakdown voltage created by the junction between the p-body of the cathode 502 and n-epi 504. The effect of the sinker region 550 is shown in FIG. 6 which shows a breakdown voltage of about 24V (curve 600) instead of approximately 54V for an embodiment without sinker region (curve 602), such as the one illustrated in FIG. 3.

In yet another embodiment, a shallow trench isolation (STI) region is formed between the two p-body regions. Since this results in a shorter space charge region, the isolation region length will determine the breakdown voltage.

Figure 7:
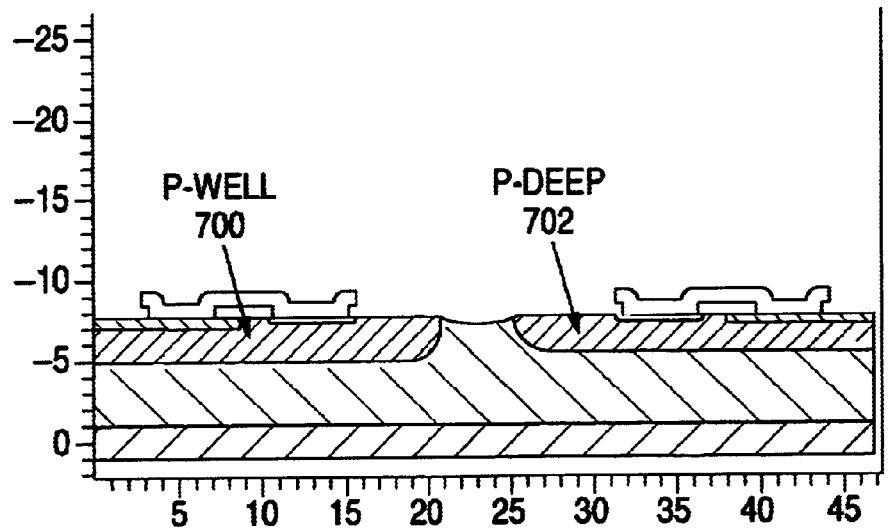
FIG. 7 is a cross-sectional view of yet another embodiment of the invention.

In many cases the output voltage is not symmetrical, but has different voltage amplitudes for the positive and negative voltages. In order to handle the different voltage amplitudes, different doping profiles can be created at the lateral junctions, using existing process implants. These may include the inclusion of a n-buried layer (NBL), n-lightly doped region (commonly referred to n-lightly doped drain (NLDD) where it is associated with the drain of a transistor device), ISO, etc. Variations in the I-V characteristics can also be achieved by shifting the mask position during doping. Either one or both of these approaches allows desirable breakdown and triggering voltages to be achieved on each side (positive and negative voltage pulse). One embodiment is shown in FIG. 7 which has a p-well 700 on one side of the structure and a p-deep region 702 on the other side. Typically a p-deep region has a lower doping level than a p-body but a higher doping level than a p-well.

Figure 8:
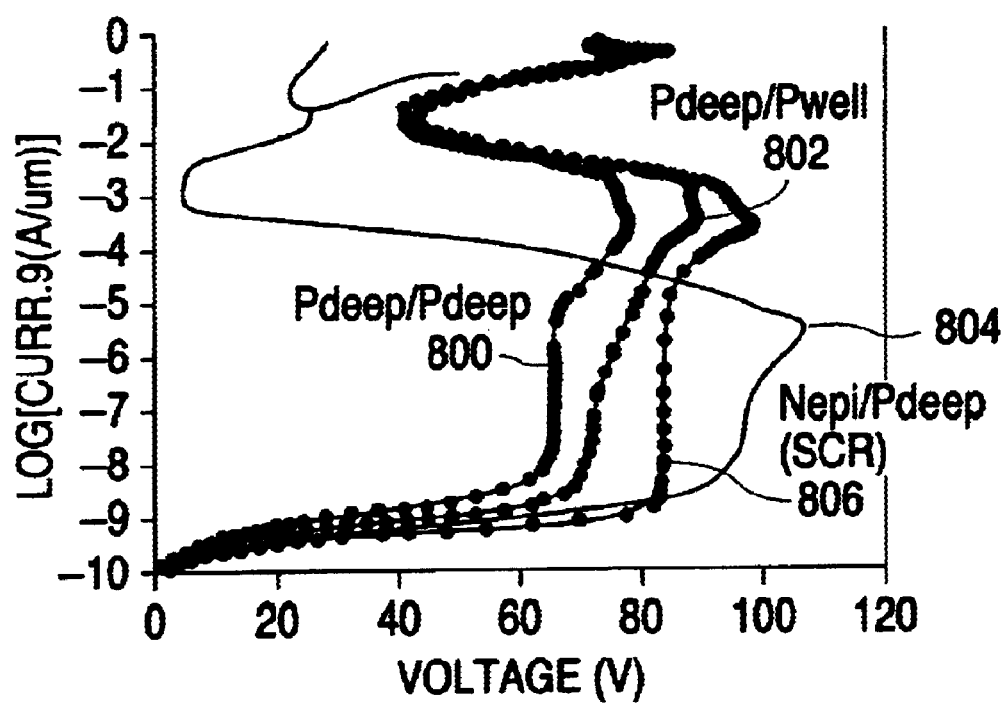
FIG. 8 shows different I–V curves.

FIG. 8 shows log current-voltage curves for some different embodiments, including a curve for an embodiments that has two p-deep regions (curve 800), a curve for an embodiment that has a p-deep and a p-well region (curve 802), such as the one illustrated in FIG. 7, and a curve for an embodiment with two p-well regions (curve 804). These are contrasted with the higher breakdown voltage of a conventional SCR (curve 806). Curves 800 and 802 show lower breakdown voltages than curve 806 for a conventional SCR, while maintaining much the same holding voltage. Curve 806, on the other hand shows a higher breakdown voltage and lower holding voltage.

Experimental results have shown that the present invention allows a bi-directional structure to be created in accordance with the invention, which has a protection capability of more than 10 A/200 μm, thus making it possible to provide protection against an ESD voltage pulse of more than 15 kV.

It will be appreciated that the invention can be implemented in using different dopings for the p-regions and the n-region between the p-regions, and that different process techniques can be used to achieve this. Also, it will be appreciated that the doping mask can be shifted. Thus the appropriate triggering and holding voltages can be achieved for positive and negative voltage pulses.

It will also be appreciated that, while the embodiments discussed above show n-epitaxial region in a p-substrate, the invention could be implemented so that the p-body, p-well, p-deep, or other p-regions formed in the n-material are formed in a n-substrate, n-well or other n-region other than a n-epitaxial region. For simplicity the term n-material will be used in the claims to define any type of n-region that the p-body, p-well, p-deep, or other p-regions are formed in.

What is claimed is:

1. A method of forming a bi-directional ESD protection device, comprising providing a semiconductor substrate, n-doping at least part of the semiconductor substrate to form n-material, masking and doping the n-material to define a first and a second p-region in the n-material that are laterally spaced from each other, forming a n+ region and a p+ region laterally spaced from each other, in each of the two p-regions, and providing a common contact for the n+ region and p+ region of the one p-region, and a common contact for the n+ region and p+ region of the other p-region, wherein the first p-region has a different doping level from the second p-region to define an asymmetrical structure.

2. A method of claim 1, wherein BiCMOS technology is used in the process steps.

3. A method of claim 2, wherein the p-regions are defined by one or more of a p-well, p-body, collector, or p-deep type implant.

4. A method of claim 3, wherein the n+ region and p+ region in each of the p-regions are formed by masking and doping the p-regions.

* * * * *